(12) United States Patent
Yang et al.

(10) Patent No.: US 12,320,468 B2
(45) Date of Patent: Jun. 3, 2025

(54) COMMUNICATION APPARATUS AND BRACKET DEVICE THEREOF

(71) Applicant: WISTRON NEWEB CORPORATION, Hsinchu (TW)

(72) Inventors: Lan-Chun Yang, Hsinchu (TW); Chun-Hung Huang, Hsinchu (TW); Li-Han Hsu, Hsinchu (TW); Yi-Chieh Lin, Hsinchu (TW)

(73) Assignee: WISTRON NEWEB CORPORATION, Hsinchu (TW)

( * ) Notice: Subject to any disclaimer, the term of this patent is extended or adjusted under 35 U.S.C. 154(b) by 567 days.

(21) Appl. No.: 17/372,581

(22) Filed: Jul. 12, 2021

(65) Prior Publication Data
US 2022/0268400 A1    Aug. 25, 2022

(30) Foreign Application Priority Data
Feb. 24, 2021  (TW) ................. 110106501

(51) Int. Cl.
*F16M 11/06* (2006.01)
*F16M 11/20* (2006.01)
*F16M 13/02* (2006.01)

(52) U.S. Cl.
CPC ........ *F16M 11/2021* (2013.01); *F16M 13/02* (2013.01); *F16M 11/06* (2013.01); *F16M 2200/04* (2013.01); *F16M 2200/06* (2013.01)

(58) Field of Classification Search
CPC .......... F16M 2200/06; F16M 2200/04; F16M 2200/047; F16M 2200/041; F16M 11/06
USPC .......... 248/123.11, 123.2, 125.9, 162.1, 408, 248/407, 406.1, 404, 292.11, 292.12, 248/292.13
See application file for complete search history.

(56) References Cited

U.S. PATENT DOCUMENTS

| | | | | |
|---|---|---|---|---|
| 5,092,552 A | * | 3/1992 | Dayton | ................. F16M 13/00 248/278.1 |
| 7,984,883 B2 | | 7/2011 | Li et al. | |
| 8,079,166 B2 | * | 12/2011 | Li | .......................... A47G 1/143 40/748 |
| 8,146,879 B2 | * | 4/2012 | Liao | ...................... A45B 11/00 248/278.1 |

(Continued)

FOREIGN PATENT DOCUMENTS

| CN | 101524222 A | 9/2009 |
|---|---|---|
| CN | 207246223 U | 4/2018 |

(Continued)

*Primary Examiner* — Alfred J Wujciak
(74) *Attorney, Agent, or Firm* — McClure, Qualey & Rodack, LLP

(57) ABSTRACT

A communication apparatus and a bracket device thereof are provided. The bracket device includes a base, a rotary shaft, a connecting member, and an elastic member. The base includes a bottom portion, a connecting portion, and a base engaging portion. The rotary shaft is rotatably disposed in the connecting portion and includes a base wall and a connecting section. The connecting member connects to the rotary shaft. The elastic member includes a body and an elastic member engaging portion. The body connects to the base wall of the rotary shaft, and the elastic member engaging portion is positioned at the body. In an engagement state, the elastic member engaging portion is engaged to the base engaging portion.

14 Claims, 15 Drawing Sheets

(56) References Cited

U.S. PATENT DOCUMENTS

| | | | | |
|---|---|---|---|---|
| 8,317,152 B1* | 11/2012 | Zhou | ................... | F16M 13/00 |
| | | | | 248/397 |
| 2005/0087058 A1* | 4/2005 | Chang | ................... | F16M 11/06 |
| | | | | 84/422.1 |
| 2005/0121578 A1* | 6/2005 | Asamarai | ................ | F16C 11/10 |
| | | | | 248/292.12 |
| 2009/0152411 A1* | 6/2009 | Tsay | ................... | F16M 11/043 |
| | | | | 248/122.1 |

FOREIGN PATENT DOCUMENTS

| | | |
|---|---|---|
| CN | 210106958 U | 2/2020 |
| CN | 210687620 U | 6/2020 |
| JP | 3151945 U | 7/2009 |

\* cited by examiner

COMMUNICATION APPARATUS AND BRACKET DEVICE THEREOF

CROSS-REFERENCE TO RELATED PATENT APPLICATION

This application claims the benefit of priority to Taiwan Patent Application No. 110106501, filed on Feb. 24, 2021. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a bracket device and a communication apparatus with the bracket device, and more particularly, to a bracket device capable of adjusting an angle of the communication apparatus.

BACKGROUND OF THE DISCLOSURE

With the continuous evolution of communication technology, the demands for communication by modern society has become more and more frequent. However, buildings in metropolitan areas are often in a close proximity to one another, and the floor height continues to increase, so users need to adjust the angle of their communication equipment to find the best signal. Therefore, it is necessary to provide a bracket device that allows users to have a good user experience while adjusting the angle of their communication equipment through the bracket device.

SUMMARY OF THE DISCLOSURE

In response to the above-referenced objective, the present disclosure provides a bracket device that allows users to feel a sense of engagement when adjusting the angle of the bracket device to a specific position, thereby providing a good user experience.

It is an object of the present disclosure to provide a bracket device that includes a base, a rotary shaft, a connecting member, and an elastic member. The base includes a bottom portion, a connecting portion, and a base engaging portion, wherein the bottom portion connects to the connecting portion, and the base engaging portion is disposed in the connecting portion. The rotary shaft is rotatably disposed in the connecting portion and includes a base wall and a connecting section. The base wall connects to the connecting section, and the connecting section is disposed in the connecting portion. The connecting member connects to the rotary shaft. The elastic member includes a body and an elastic member engaging portion, wherein the body connects to the base wall of the rotary shaft portion, and the elastic member engaging portion is positioned at the body and has an engaging surface that is protruded or recessed. In an engagement state, the elastic member engaging portion is engaged to the base engaging portion, and in a disengagement state, the elastic member engaging portion is disengaged from the base engaging portion.

It is another object of the present disclosure to provide a bracket device that includes a base, a rotary shaft, a connecting member, and an elastic member. The base includes a bottom portion, a connecting portion connected to the bottom portion, and a base engaging portion disposed in the connecting portion. The rotary shaft is rotatably disposed in the connecting portion and includes a base wall, a connecting section, and a notch. The connecting section connects to the base wall and is disposed in the connecting portion of the base, and the notch is positioned at at least one of the connecting section and the base wall. The connecting member connects to the rotary shaft. The elastic member includes a body and an elastic member engaging portion, wherein the body connects to the base wall of the rotary shaft and passes through the notch, and the elastic member engaging portion is positioned at the body. In an engagement state, the elastic member engaging portion is engaged to the base engaging portion.

It is another object of the present disclosure to provide a communication apparatus that includes a bracket device and a communication device. The bracket device includes a base, a rotary shaft, an elastic member, and a connecting member. The base includes a bottom portion, a connecting portion connected to the bottom portion, and a base engaging portion disposed in the connecting portion. The rotary shaft is rotatably disposed in the connecting portion and includes a base wall and a connecting section, and the connecting section is disposed in the connecting portion of the base. The elastic member includes a body and an elastic member engaging portion, wherein the body connects to the base wall of the rotary shaft, and the elastic member engaging portion is positioned at the body and has an engaging surface. The engaging surface is protruded or recessed. The connecting member connects to the rotary shaft, and the communication device connects to the connecting member. In an engagement state, the elastic member engaging portion is engaged to the base engaging portion. In a disengagement state, the elastic member engaging portion is disengaged from the base engaging portion.

In view of the above, in an engagement state, the elastic member engaging portion of the bracket device according to the present disclosure is engaged to the base engaging portion. When the user adjusts the angle of the bracket device, the rotary shaft is driven to rotate to a specific position, which leads the bracket device to enter the engagement state where the elastic member engaging portion is engaged to the base engaging portion, and as such, the user is able to feel the sense of engagement and clearly acknowledge that the bracket device has been adjusted to the specific position.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
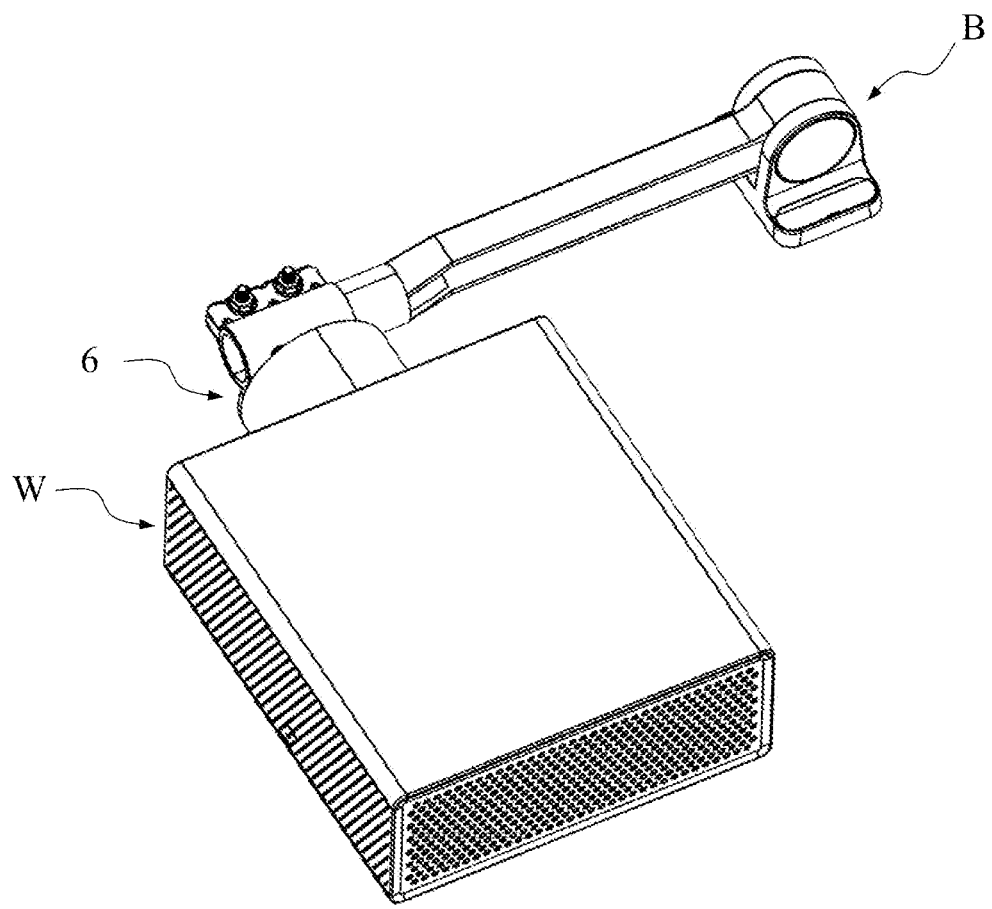
FIG. 1 is a schematic diagram of a communication apparatus according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Referring to FIG. 1, a communication apparatus according to a first embodiment of the present disclosure includes a communication device W, a connecting assembly 6, and a bracket device B. The communication device W is connected to the connecting assembly 6, and the connecting assembly 6 is connected to the bracket device B.

Figure 2:
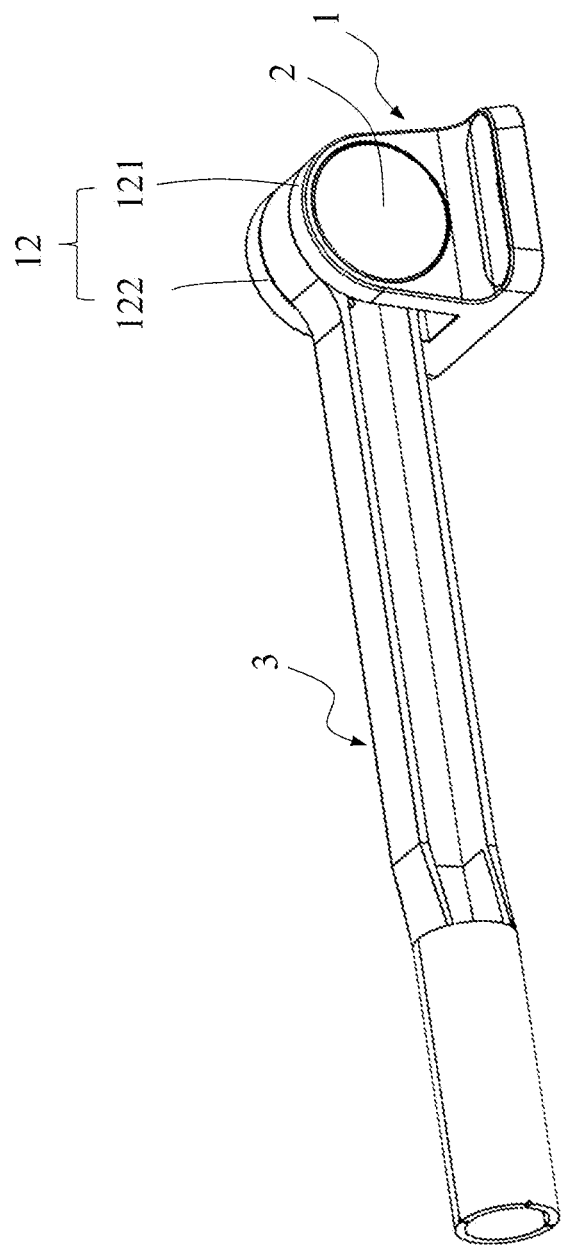
FIG. 2 is a schematic diagram of a bracket device according to the first embodiment of the present disclosure.
Figure 3:
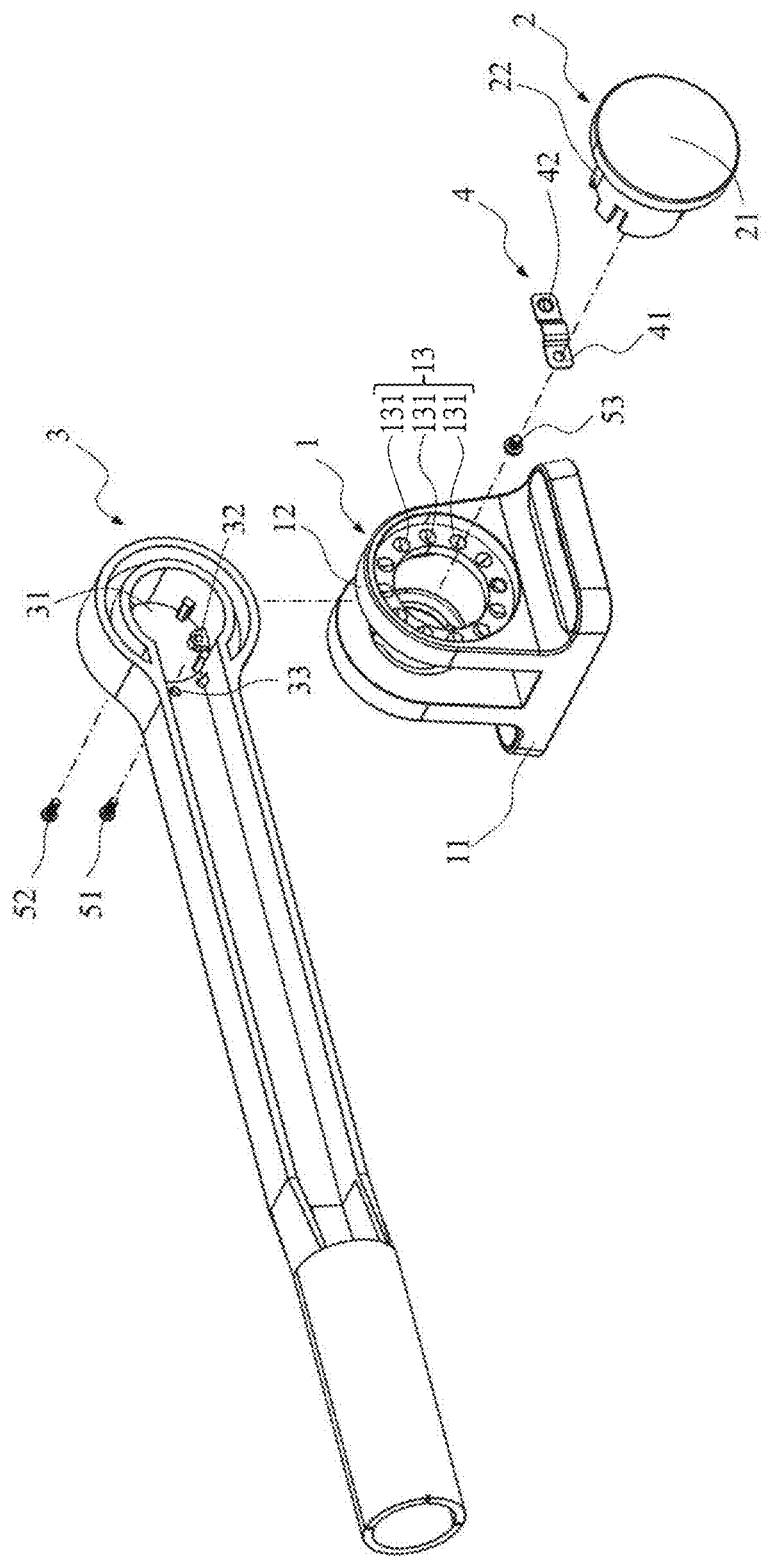
FIG. 3 is an exploded schematic diagram of a bracket device according to the first embodiment of the present disclosure.

Referring to FIG. 2 and FIG. 3, the bracket device B includes a base 1, a rotary shaft 2, a connecting member 3, and an elastic member 4. The rotary shaft 2 is rotatably disposed in the base 1 and connected to the connecting member 3. In this embodiment, the bracket device B further includes a plurality of fasteners 51, 52, 53, wherein the fasteners 51, 52 are used to connect the connecting member 3 and the rotary shaft 2, and the fastener 53 is used to connect the elastic member 4 and the rotary shaft 2. The fasteners 51, 52, 53 are screws but the present disclosure is not limited thereby. In this embodiment, the communication device W is connected to the connecting member 3 through the connecting assembly 6, but in other embodiments, the communication device W can be connected to the connecting member 3 directly or indirectly through other means.

Figure 4:
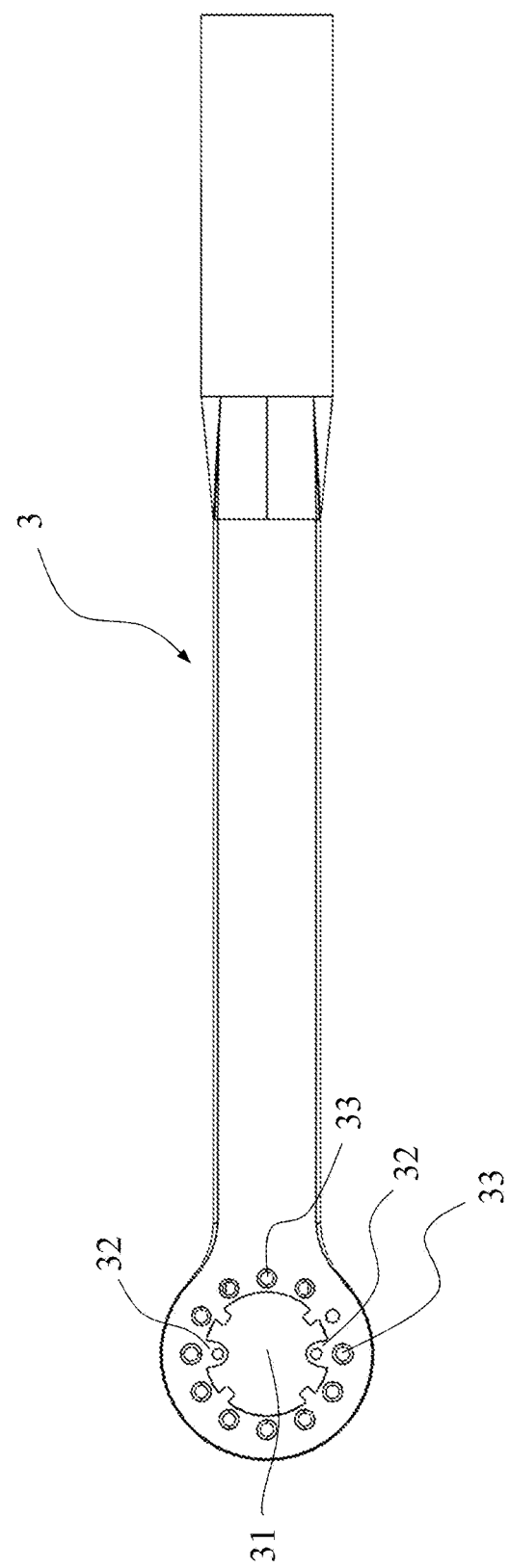
FIG. 4 is a side view of a connecting member according to the first embodiment of the present disclosure.

Referring to FIG. 3 and FIG. 4, the connecting member 3 has a through hole 31, a plurality of first fastening portions 32, and a plurality of connecting member fastening holes 33, wherein the plurality of connecting member fastening holes 33 surround the through hole 31.

Figure 5:
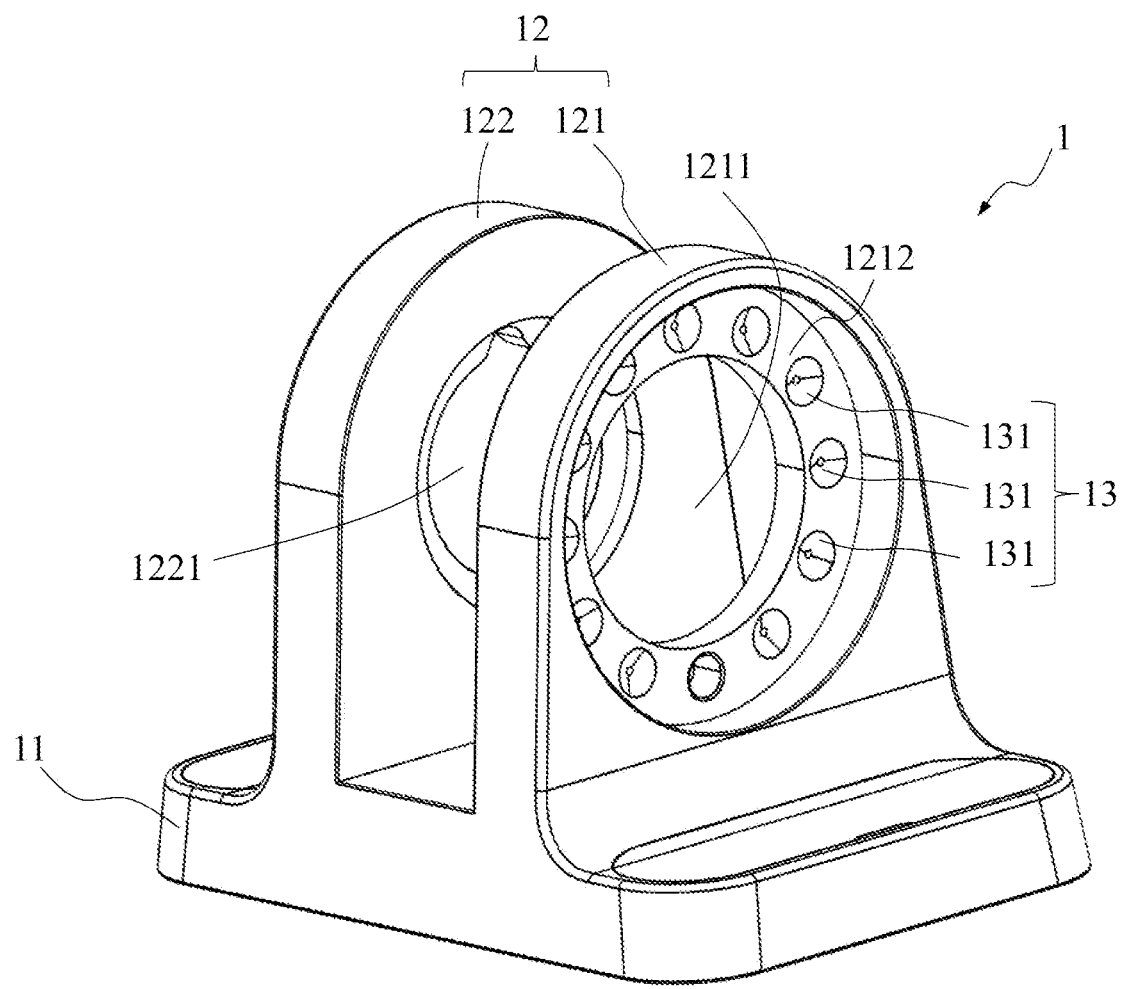
FIG. 5 is a schematic diagram of a base according to the first embodiment of the present disclosure.
Figure 6:
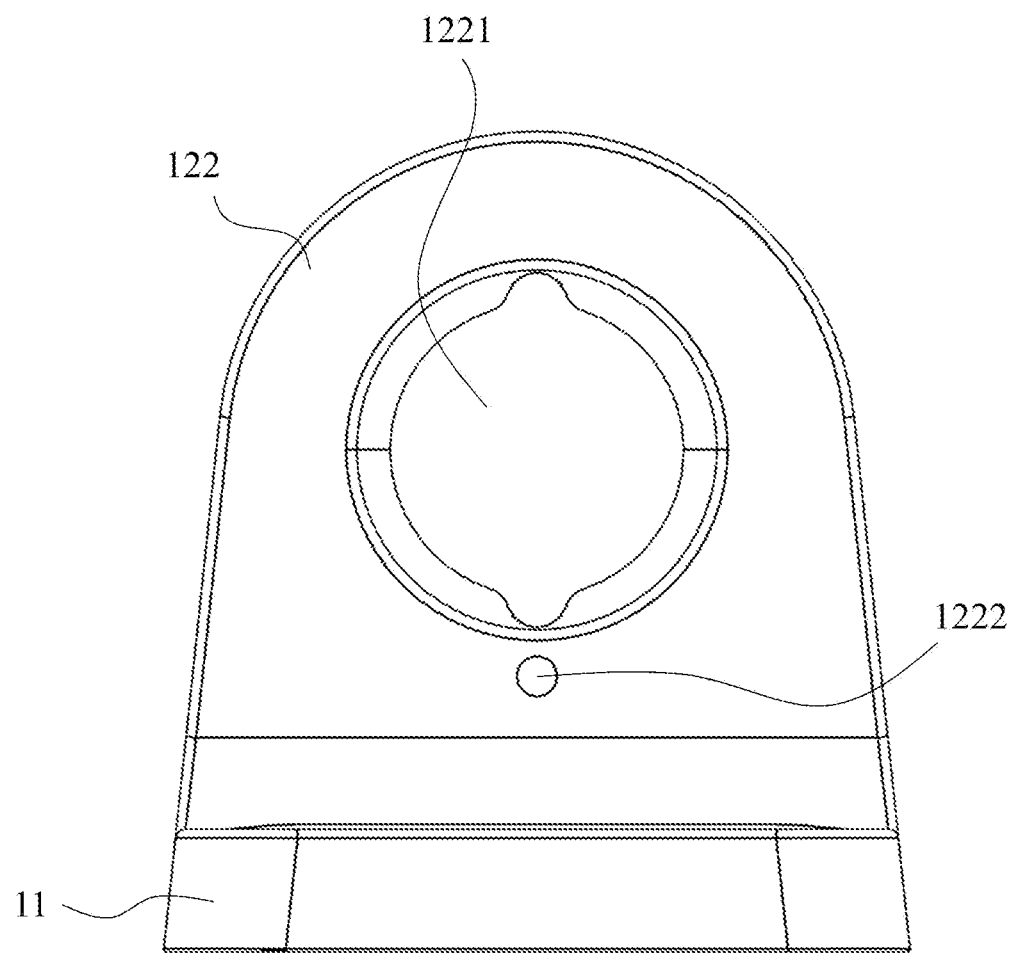
FIG. 6 is a side view of a base according to the first embodiment of the present disclosure.
Figure 7:
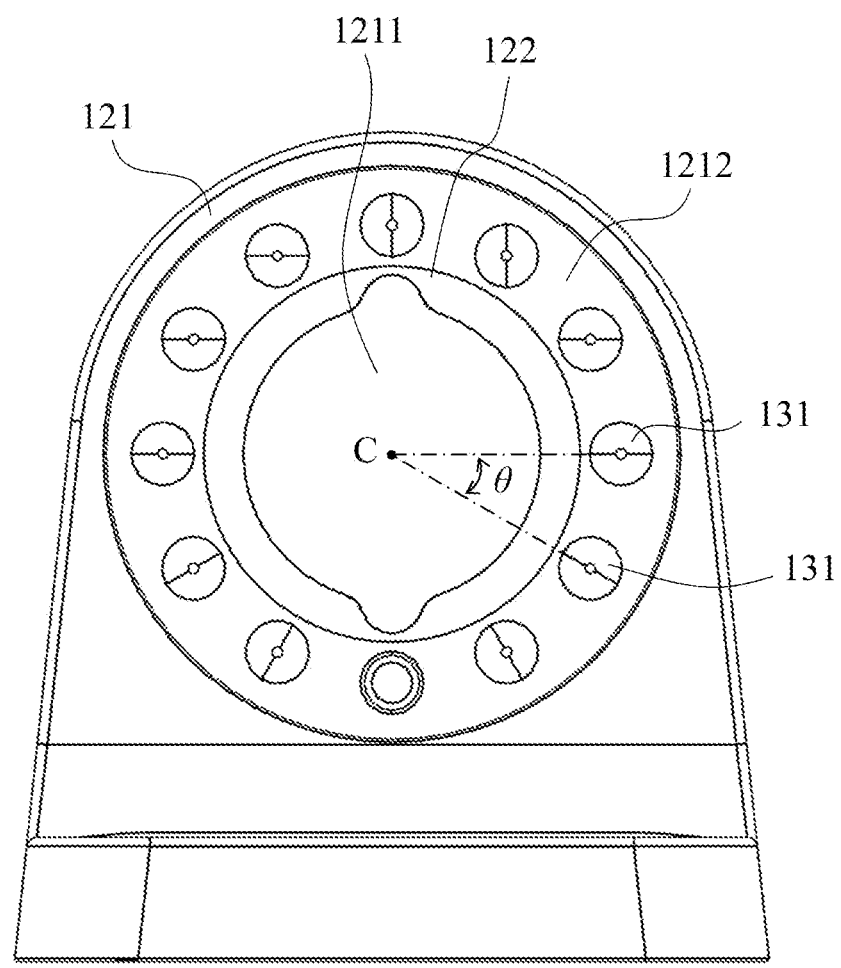
FIG. 7 is a side view of a base from another viewing angle according to the first embodiment of the present disclosure.

Referring to FIG. 5, FIG. 6, and FIG. 7, the base 1 includes a bottom portion 11, a connecting portion 12, and a base engaging portion 13. The connecting portion 12 includes a first support wall 121 and a second support wall 122, and the first support wall 121 and the second support wall 122 are respectively connected to the bottom portion 11. The first support wall 121 has a first opening 1211 and a recessed surface 1212, wherein the recessed surface 1212 is recessed in a direction toward the second support wall 122 and surrounds the first opening 1211. The second support wall 122 has a second opening 1221 and a base fastening hole 1222. The first opening 1211 and the second opening 1221 are disposed for the rotary shaft 2 to pass through. The base engaging portion 13 has a plurality of engaging sections 131. The engaging sections 131 surround the recessed surface 1212 and are equally spaced, and the engaging sections 131 are circular recesses. In addition, two adjacent engaging sections 131 have a first angle θ between them relative to a center point C of the first opening 1211. In this embodiment, the first angle θ is 30 degrees.

Referring to FIG. 2, FIG. 3, and FIG. 5, the rotary shaft is rotatably disposed in the connecting portion 12 and includes a base wall 21 and a connecting section 22 connected to the base wall 21. The connecting section 22 is used to pass through the first opening 1211 and the second opening 1221 such that the connecting section 22 is rotatably disposed in the connecting portion 12 of the base 1. The connecting section 22 is also used to pass through the through hole 31 of the connecting member 3.

Figure 8:
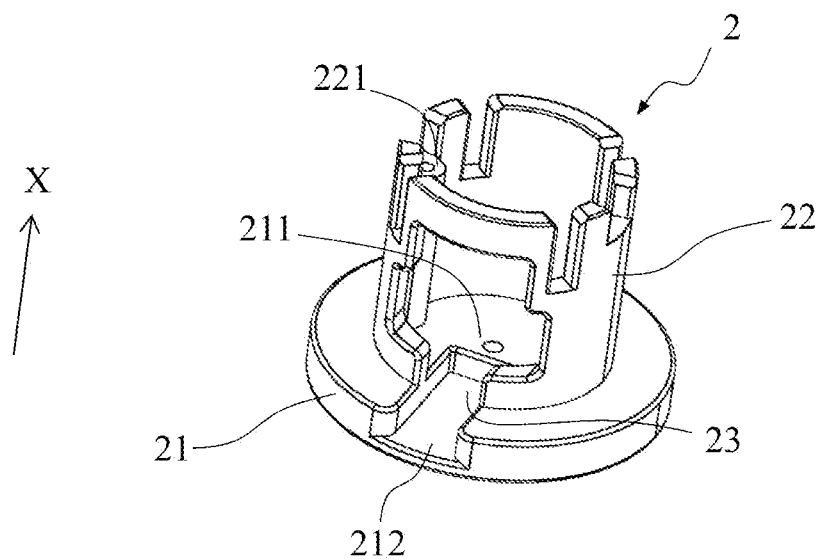
FIG. 8 is a schematic diagram of a rotary shaft according to the first embodiment of the present disclosure.
Figure 9:
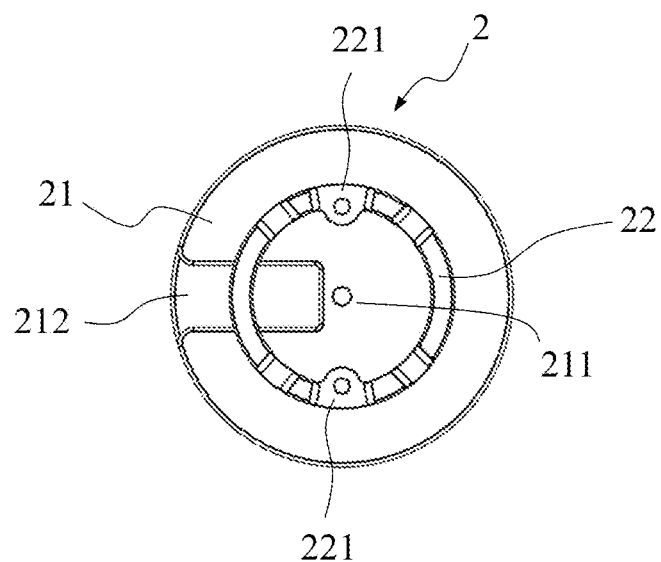
FIG. 9 is a top view of a rotary shaft according to the first embodiment of the present disclosure.

Referring to FIG. 8 and FIG. 9, the rotary shaft 2 further includes a notch 23. The connecting section 22 extends from the base wall 21 toward a first direction X, wherein the first direction X is a direction away from the base wall 21. The base wall 21 has a center portion 211 and a periphery portion 212, and the notch 23 is positioned at the junction of the base wall 21 and the connecting section 22 and is between the center portion 211 and the periphery portion 212. In other embodiments, the notch may be positioned only at the connecting section 22 or the base wall 21, as long as a body 41 of the elastic member 4 can pass through. The connecting section 22 has a plurality of second fastening portions 221.

Figure 10:
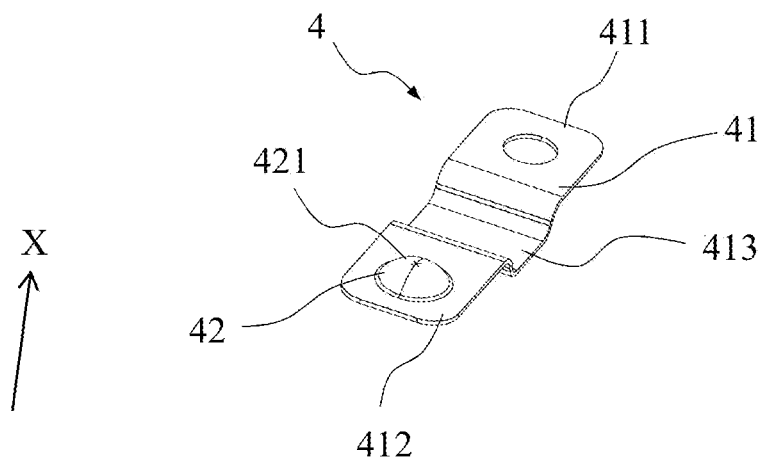
FIG. 10 is a schematic diagram of an elastic member according to the first embodiment of the present disclosure.
Figure 11:
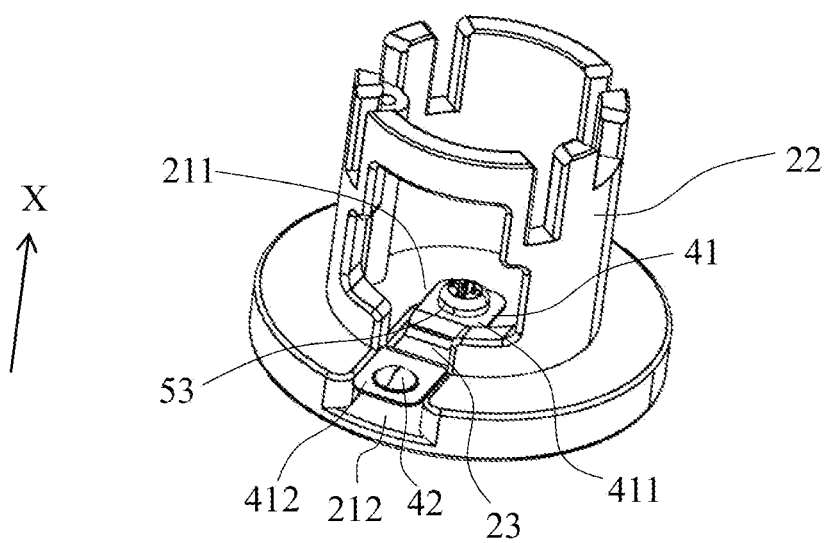
FIG. 11 is a schematic diagram of an elastic member fastened to a rotary shaft according to the first embodiment of the present disclosure.
Figure 12:
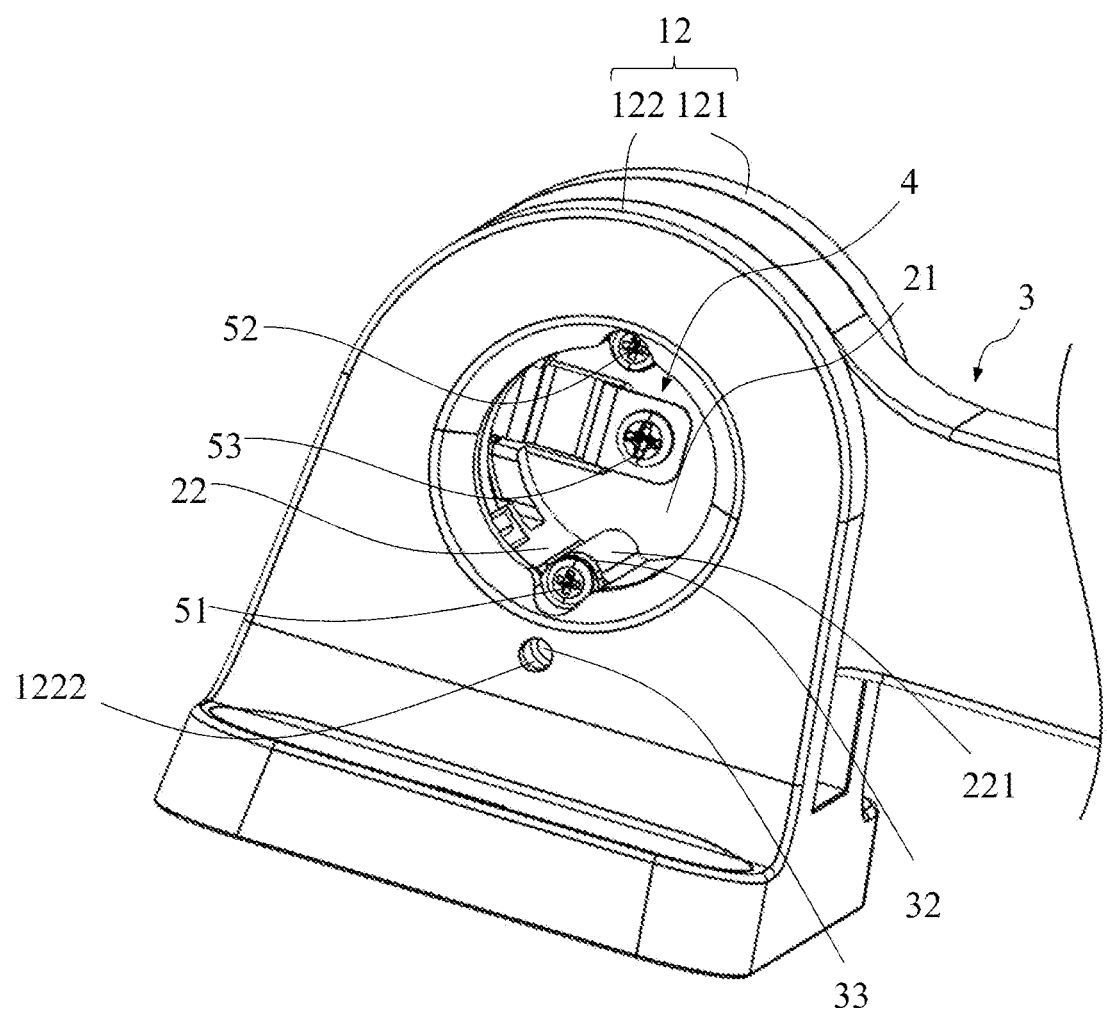
FIG. 12 is a schematic diagram of a bracket device from another viewing angle according to the first embodiment of the present disclosure.

Referring to FIG. 10 and FIG. 11, the elastic member 4 includes a body 41 and an elastic member engaging portion 42. The body 41 is sheet-like in shape and has a first end 411, a second end 412, and a bending portion 413 between the first end 411 and the second end 412. The elastic member 4 has a certain level of elastic effect and is a flat spring in this embodiment, but the elastic member 4 could be other elements with elastic effect in other embodiments, the present disclosure is not limited thereto. The first end 411 is fixedly connected to the center portion 211 of the base wall 21 through the fastener 53. The body 41 passes through the notch 23, and the second end 412 is placed on the periphery portion 212. The elastic member engaging portion 42 is positioned at the body 41 and has an engaging surface 421 that faces toward the first direction X. In this embodiment, the elastic member engaging portion 42 is circular, and the engaging surface 421 is protruded, for engaging with the engaging sections 131, which are circular recesses, of FIG. 5. The shape of the engaging sections 131 corresponds to the elastic member engaging portion 42. The recess and the protrusion on the engaging sections and the engaging surface are arranged such that they correspond to each other, and so in other embodiments, it could be that the engaging sections are protrusions and the engaging surface is recessed for engaging with one another.

Referring to FIG. 3, FIG. 4, FIG. 8, and FIG. 12, the fasteners 51, 52 respectively pass through the first fastening portions 32 and the second fastening portions 221 and fixedly connect the connecting member 3 and the rotary shaft 2. Since the connecting member 3 and the rotary shaft 2 are in a fixedly connected state, when the connecting member 3 is rotated by a force, the rotary shaft 2 is driven to rotate therewith, and the rotary shaft 2 also drives the elastic member 4 which is fixedly connected thereto to rotate together. In other words, when the connecting member 3 rotates due to a force, the connecting member 3 simultaneously drives the elastic member 4 to rotate. Moreover, the angle at which the connecting member 3 rotated under force is the same as the angle at which the elastic member 4 is driven to rotate.

Figure 13:
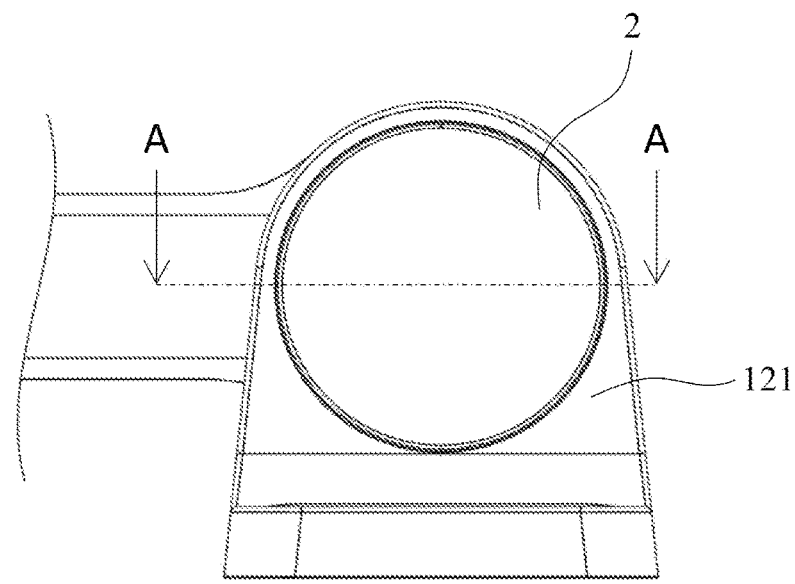
FIG. 13 is a side view of a bracket device according to the first embodiment of the present disclosure.
Figure 14:
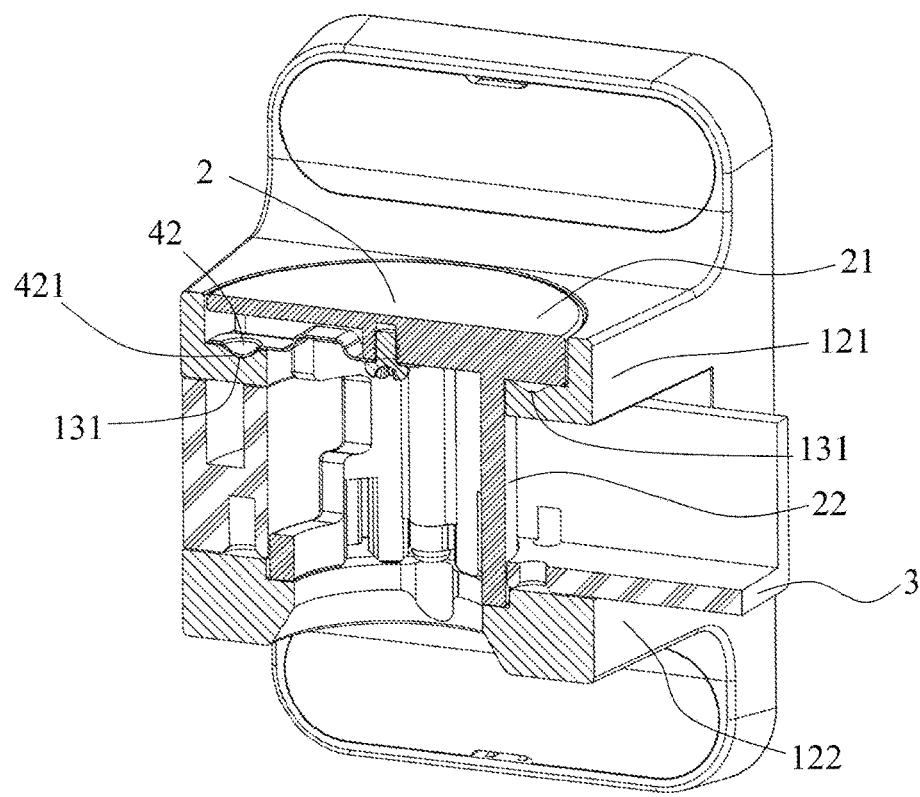
FIG. 14 is a cross-sectional view taken along line A-A of FIG. 13.

Referring to FIG. 13 and FIG. 14, the connecting section 22 of the rotary shaft 2 is passed through the first support wall 121 and the second support wall 122, and the base wall 21 is placed on the first support wall 121. FIG. 14 shows the elastic member engaging portion 42 and the engaging sections 131 in an engagement state, wherein the elastic member engaging portion 42 is engaged to one of the engaging sections 131, and the engaging surface 421 contacts one of the engaging sections 131.

Furthermore, in a disengagement state, the elastic member engaging portion 42 is disengaged from the engaging sections 131. For example, if the connecting member 3 is being rotated under force and drives the elastic member 4 to rotate, as the elastic member engaging portion 42 as shown in FIG. 14 is moved out of one of the engaging sections 131 and is not yet engaged to another engaging section 131, the elastic member 4 and the engaging sections 131 are changed from the engagement state to the disengagement state.

Figure 15:
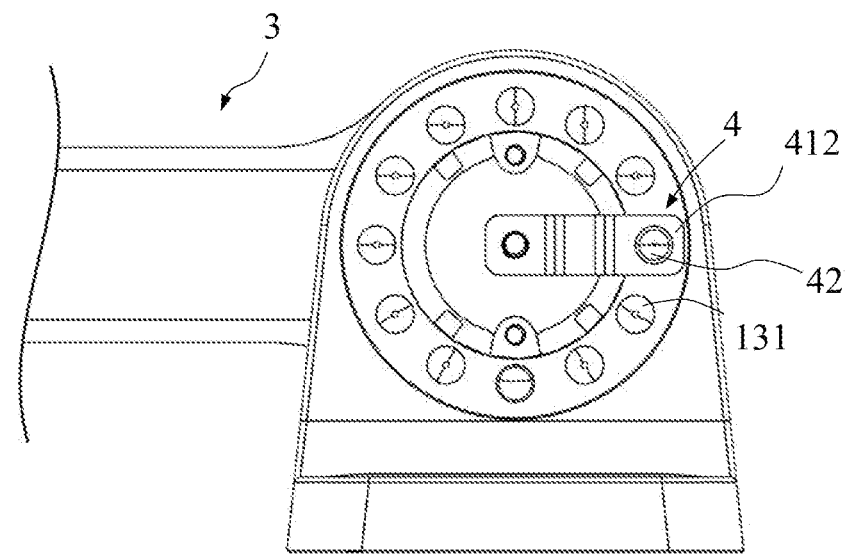
FIG. 15 is a perspective view of a bracket device according to the first embodiment of the present disclosure.
Figure 16:
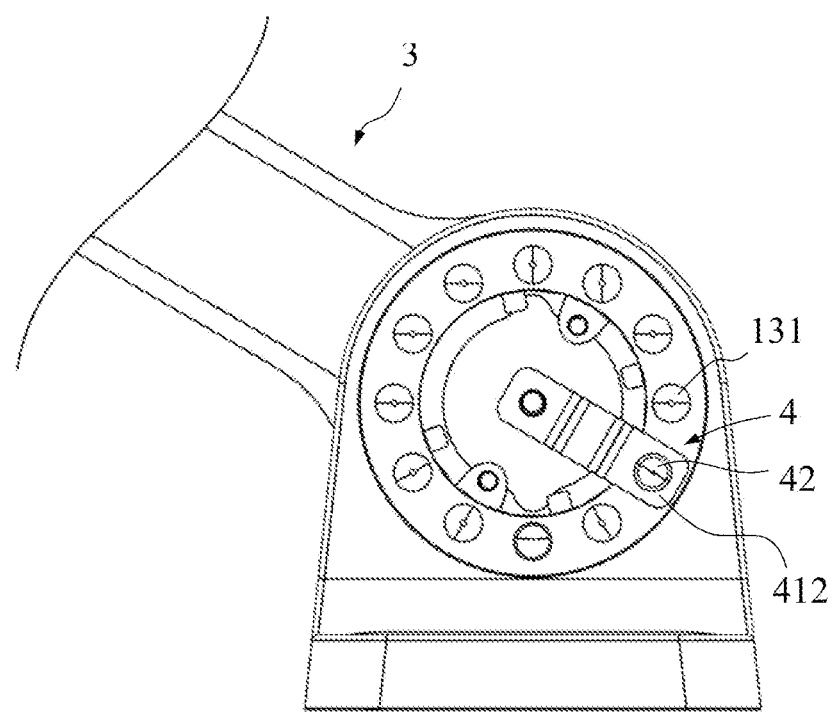
FIG. 16 is another perspective view of a bracket device according to the first embodiment of the present disclosure.
Figure 17:
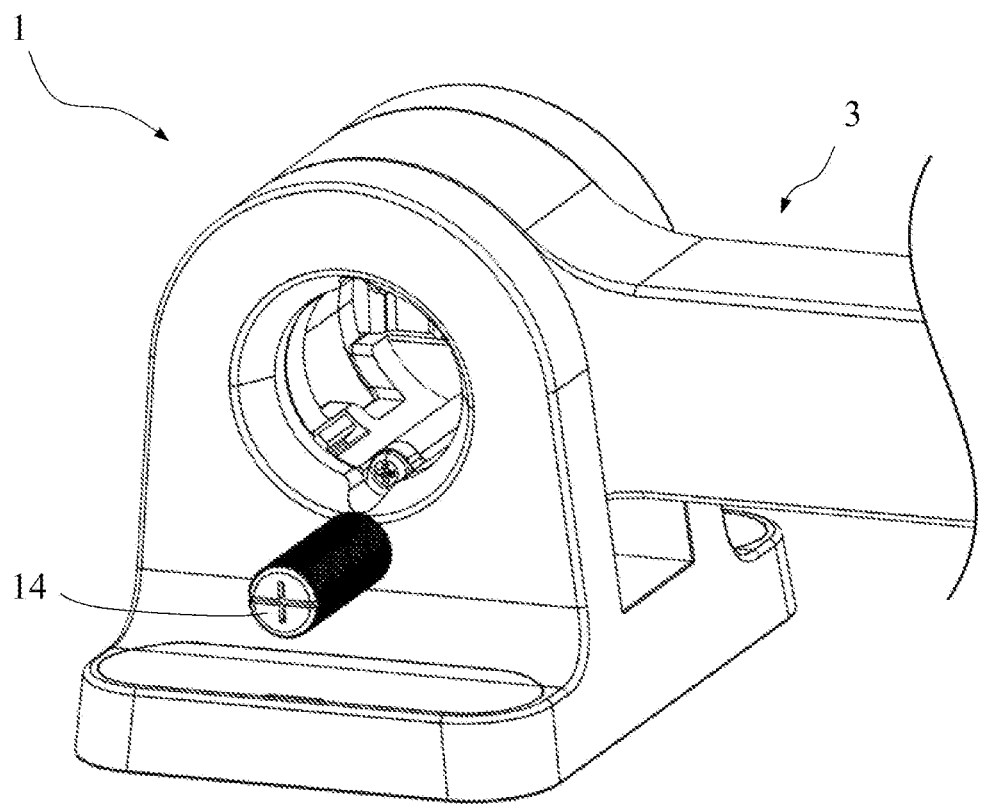
FIG. 17 is a schematic diagram of a bracket device with a fastening member according to the first embodiment of the present disclosure.

Next, the relative relation between the elastic member and the base when a user is adjusting the angle of the bracket device will be described in reference to FIG. 15 and FIG. 16. When the user wants to perform an angle adjustment with the bracket device, the user can apply force directly on the connecting member 3 to make it rotate, which in turn drives the elastic member 4 to start rotating such that the elastic member engaging portion 42 is removed from one of the engaging sections 131 and continues to move to an adjacent one of the engaging sections 131. During the movement, the elastic member engaging portion 42 and the engaging sections 131 go from the original engagement state to a disengagement state where the elastic member engaging portion 42 is not engaged with any of the engaging sections 131, and then reenter into the engagement state. As such, the user can feel a feedback of the elastic member engaging portion 42 disengaging from the engaging section and reengaging to the engaging section sequentially during the angle adjustment process, and thus a sense of engagement is formed. Because the angle at which the elastic member 4 is driven to rotate and the angle at which the connecting member 3 rotated under force have the same value, the connecting member 3 is also rotated by a unit of the first angle θ. The user is able to acknowledge that the connecting member 3 has been adjusted by one unit of the first angle from the aforementioned sense of engagement, which is an angle adjustment of 30 degrees in this embodiment. At this time, the connecting member 3 is adjusted to a position that is of a 30 degrees difference from its original position. If the user wants to further adjust the connecting member 3 to other specific positions, the user can continue to apply force and go through the similar process again and again until the connecting member 3 is adjusted to the desired specific position.

Referring to FIG. 4, FIG. 6, FIG. 12, and FIG. 17, the base 1 further includes a fastening member 14 for passing through the base fastening hole 1222 and at least one of the connecting member fastening holes 33 of the connecting member 3 to immovably fix the connecting member 3 to the base 1. Thus, the connecting member 3 is restricted from rotating and a fixed state is formed. The connecting member fastening holes 33 are configured to correspond to the base fastening hole 1222 so that when the connecting member 3 is adjusted to several different specific positions, one of the connecting member fastening holes 33 is in alignment to and in communication with the base fastening hole 1222. In other words, at each of the different specific positions, a different connecting member fastening hole is in alignment to and in communication with the base fastening hole. Therefore, the fastening member 14 is able to pass through both the base fastening hole 1222 and one of the connecting member fastening holes 33 to fix the connecting member 33 in place. When the bracket device has been adjusted to the desired specific position, the user can affix and restrict the position of the bracket device with the fastening member 14. When the angle needs to be adjusted again, the user simply removes the fastening member 14 and adjusts the position of the bracket device. In this embodiment, the fastening member 14 is a bolt but the present disclosure is not limited thereby.

The bracket device of the present disclosure transitions from the engagement state to the disengagement state and then to the engagement state again every 30 degrees during the angle adjustment process, so that the user feels a distinct sense of engagement feedback. Without special markings, the user is able to intuitively acknowledge how many times of the 30 degrees have elapsed and adjusted and therefore obtains a good user experience with the communication apparatus and the bracket device of the present disclosure.

Second Embodiment

Figure 18:
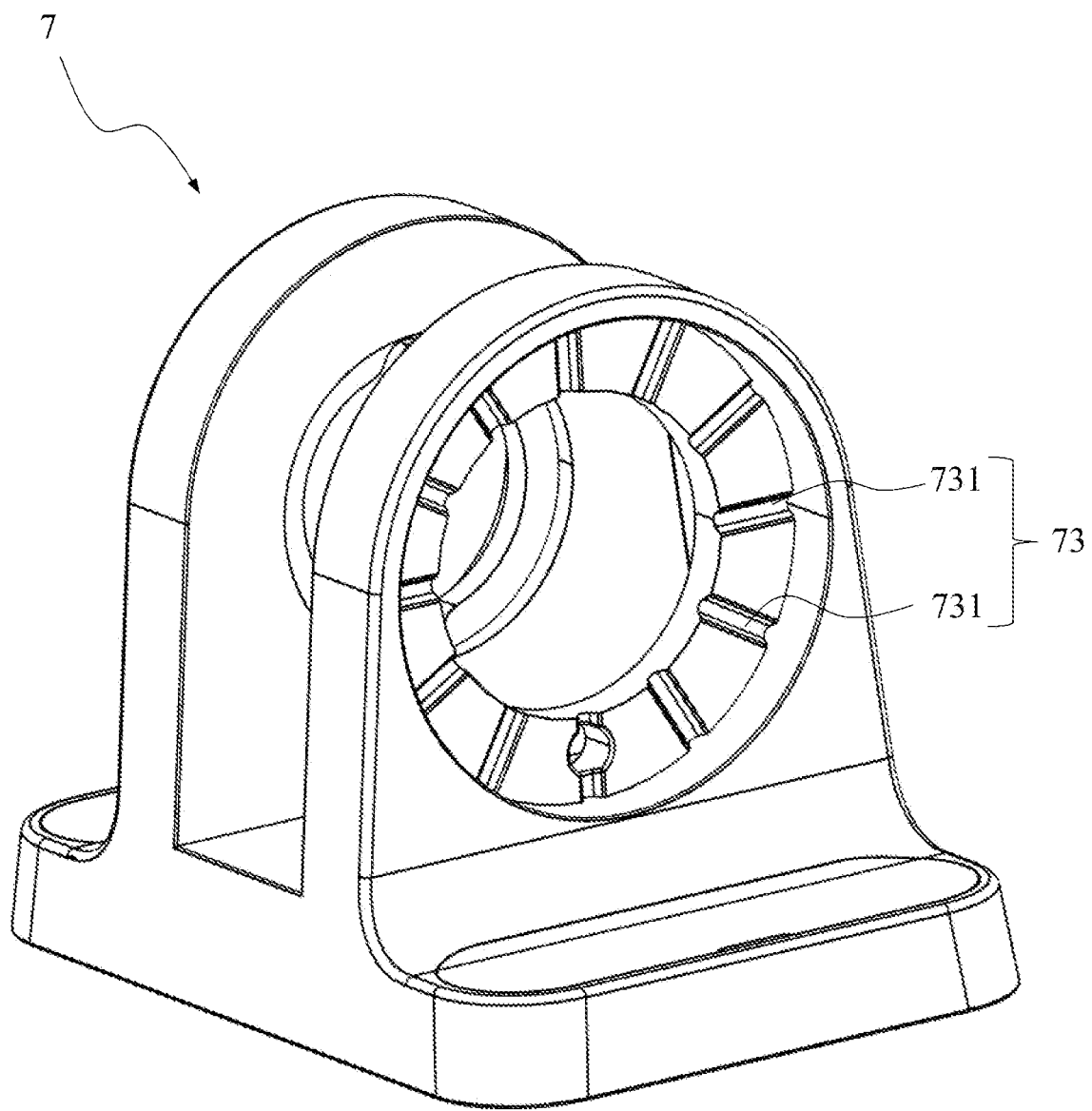
FIG. 18 is a schematic diagram of a base according to a second embodiment of the present disclosure.
Figure 19:
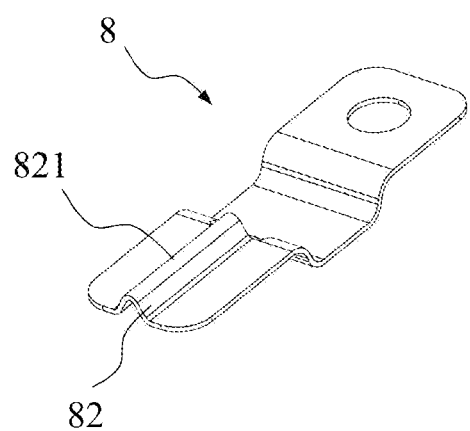
FIG. 19 is a schematic diagram of an elastic member according to the second embodiment of the present disclosure.

The second embodiment and the first embodiment differ in the design of some parts of the elastic member and the base. Referring to FIG. 18 and FIG. 19, the base 7 includes a base engaging portion 73, and the base engaging portion 73 has a plurality of engaging sections 731. The elastic member 8 includes an elastic member engaging portion 82, and the elastic member engaging portion 82 has a protruding engaging surface 821. The differences between the second embodiment and the first embodiment are that the engaging sections 731 are bar-shaped recesses and the elastic member engaging portion 82 are correspondingly bar-shaped for engaging to the engaging sections 731.

It is to be noted that the present disclosure does not limit the shapes of the elastic member engaging portion and the engaging sections, as long as their shapes correspond to each other for them to engage with each other.

Through the technical solution of collaborating the elastic member and the base to provide the sense of engagement feedback at specific positions, the communication apparatus and the bracket device of the present disclosure allow users to intuitively acknowledge the magnitude of angle adjusted during angle adjustment and to obtain a good user experience The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A bracket device for adjusting an angle of a communication apparatus, comprising:
   a base, comprising:
   a bottom portion for mounting on a substantially planar surface;
   a connecting portion, connected to the bottom portion; and
   a base engaging portion, disposed in the connecting portion;
   a rotary shaft, rotatably disposed in the connecting portion and comprising:
   a base wall;
   a connecting section, connected to the base wall and disposed in the base engaging portion of the connecting portion; and
   a notch formed in the connecting section and the base wall;
   a connecting member for supporting the communication apparatus, rotatable mounted in the connection section and connected to the rotary shaft; and
   an elastic member, comprising:
   a body, connected to the base wall of the rotary shaft and passing through the notch; and
   an elastic member engaging portion, positioned at the body and comprising an engaging surface, and the engaging surface is protruded or recessed;
   wherein, in an engagement state, the elastic member engaging portion is engaged to the base engaging portion; and
   in a disengagement state, the elastic member engaging portion is disengaged from the base engaging portion.

2. The bracket device according to claim 1, wherein the connecting section extends from the base wall toward a first direction, and the engaging surface faces toward the first direction.

3. The bracket device according to claim 1, wherein the body comprises a first end and a second end, the base wall comprises a center portion and a periphery portion, the first end connects to the center portion, and the second end connects to the periphery portion.

4. The bracket device according to claim 1, wherein the connecting portion comprises a first support wall and a second support wall respectively connected to the bottom portion, the first support wall comprises a first opening and a recessed surface, and the recessed surface is recessed in a direction toward the second support wall and surrounds the first opening.

5. The bracket device according to claim 4, wherein the base engaging portion comprises a plurality of engaging sections disposed on the recessed surface and shaped in correspondence to the elastic member engaging portion; in the engagement state, the elastic member engaging portion is engaged to one of the plurality of engaging sections; and in the disengagement state, the elastic member engaging portion is disengaged from the plurality of engaging sections.

6. The bracket device according to claim 4, wherein the base further comprises a fastening member, the second support wall comprises a base fastening hole, the connecting member comprises a plurality of connecting member fastening holes positioned in correspondence to the base fastening hole; in a fixed state, the fastening member passes through the base fastening hole and one of the plurality of connecting member fastening holes to immovably fix the connecting member to the base.

7. The bracket device according to claim 1, wherein the body comprises a bending portion.

8. The bracket device according to claim 1, wherein the elastic member engaging portion is circular or bar-shaped.

9. A bracket device for adjusting an angle of a communication apparatus, comprising:
   a base, comprising:
   a bottom portion for mounting on a substantially planar surface;
   a connecting portion, connected to the bottom portion; and
   a base engaging portion, disposed in the connecting portion;
   a rotary shaft, rotatably disposed in the connecting portion and comprising:
   a base wall,
   a connecting section, connected to the base wall and disposed in the base engaging portion of the connecting portion of the base; and
   a notch, formed in the connecting section and the base wall;

a connecting member for supporting the communication apparatus, rotatable mounted in the connection section and connected to the rotary shaft; and an elastic member, comprising:

a body, connected to the base wall of the rotary shaft and passing through the notch; and an elastic member engaging portion positioned at the body;

wherein, in an engagement state, the elastic member engaging portion is engaged to the base engaging portion; and in a disengagement state, the elastic member engaging portion is disengaged from the base engaging portion.

10. The bracket device according to claim 9, wherein the body comprises a first end and a second end, the base wall comprises a center portion and a periphery portion, the first end connects to the center portion, and the second end connects to the periphery portion.

11. The bracket device according to claim 9, wherein the connecting portion comprises a first support wall and a second support wall respectively connected to the bottom portion, the first support wall comprises a first opening and a recessed surface, and the recessed surface is recessed in a direction toward the second support wall and surrounds the first opening.

12. The bracket device according to claim 11, wherein the base engaging portion comprises a plurality of engaging sections disposed on the recessed surface and shaped in correspondence to the elastic member engaging portion; in the engagement state, the elastic member engaging portion is engaged to one of the plurality of engaging sections; and in a disengagement state, the elastic member engaging portion is disengaged from the plurality of engaging sections.

13. The bracket device according to claim 9, wherein the body further comprises a bending portion.

14. The bracket device according to claim 9, wherein the elastic member engaging portion is circular or bar-shaped.

* * * * *